(12) United States Patent
Maier

(10) Patent No.: US 11,924,971 B2
(45) Date of Patent: Mar. 5, 2024

(54) PRINTED CIRCUIT BOARD ARRANGEMENT, INVERTER, AND MOTOR VEHICLE

(71) Applicant: ZF Friedrichshafen AG, Friedrichshafen (DE)

(72) Inventor: Thomas Maier, Neunburg v. Wald (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 40 days.

(21) Appl. No.: 17/522,205

(22) Filed: Nov. 9, 2021

(65) Prior Publication Data

US 2022/0159841 A1 May 19, 2022

(30) Foreign Application Priority Data

Nov. 13, 2020 (DE) .......................... 102020214311.0

(51) Int. Cl.
*G01R 15/14* (2006.01)
*G01R 19/00* (2006.01)
*H05K 1/18* (2006.01)

(52) U.S. Cl.
CPC ........... *H05K 1/181* (2013.01); *G01R 15/148* (2013.01); *G01R 19/0092* (2013.01); *H05K 2201/10151* (2013.01); *H05K 2201/10272* (2013.01); *H05K 2201/10515* (2013.01)

(58) Field of Classification Search
CPC .......... H05K 2201/10272; H05K 2201/10515; H05K 2201/10151; H05K 1/181; H05K 1/0265; H02M 7/003; H02M 7/42
See application file for complete search history.

(56) References Cited

U.S. PATENT DOCUMENTS

| | | | |
|---|---|---|---|
| 5,041,780 A * | 8/1991 | Rippel ................. | G01R 15/207 324/251 |
| 2003/0090356 A1* | 5/2003 | Saito .................. | G01R 19/2513 336/213 |
| 2011/0193557 A1* | 8/2011 | Motz ...................... | H01L 27/22 324/252 |
| 2012/0081110 A1* | 4/2012 | Racz ..................... | G01R 15/202 324/252 |
| 2012/0112365 A1* | 5/2012 | Ausserlechner ........ | H01L 23/16 438/126 |
| 2014/0182898 A1* | 7/2014 | Lassmann ............ | H05K 5/0082 174/266 |
| 2014/0253103 A1* | 9/2014 | Racz ..................... | G01R 15/202 324/149 |
| 2014/0333301 A1* | 11/2014 | Racz ...................... | G01R 15/20 324/251 |
| 2019/0212372 A1* | 7/2019 | Bilbao De Mendizabal ............... | G01R 33/09 |
| 2020/0132728 A1* | 4/2020 | Boury ................... | H01L 43/065 |
| 2020/0319233 A1* | 10/2020 | Wandres ............ | G01R 19/0092 |
| 2021/0282271 A1* | 9/2021 | Eichner .................. | H05K 1/144 |

* cited by examiner

*Primary Examiner* — Dominic E Hawkins
(74) *Attorney, Agent, or Firm* — Kristin L. Murphy

(57) ABSTRACT

The disclosure relates to a printed circuit board arrangement with a printed circuit board with at least two current conducting layers. The current conducting layers extend in an axial direction of the printed circuit board and are arranged in succession in a thickness direction of the printed circuit board. The printed circuit board arrangement has a busbar which is arranged on a lateral surface of the printed circuit board and is in contact with at least one part of the current conducting layers of the printed circuit board.

19 Claims, 2 Drawing Sheets

PRINTED CIRCUIT BOARD ARRANGEMENT, INVERTER, AND MOTOR VEHICLE

CROSS-REFERENCE TO RELATED APPLICATION

This application claims priority to German Patent Application No. 102020214311.0, filed Nov. 13, 2020, the disclosure of which is incorporated herein by reference in its entirety.

TECHNICAL FIELD

The disclosure relates to a printed circuit board arrangement with a printed circuit board with at least two current conducting layers, wherein the current conducting layers extend in an axial direction of the printed circuit board and are arranged in succession in the thickness direction of the printed circuit board.

BACKGROUND

Printed circuit boards are used to receive and electrically connect components. A printed circuit board has electrically conductive elements and electrically insulating elements. In particular, layers made of copper are used as electrically conductive elements. Stacking a plurality of layers made of copper on top of one another in a printed circuit board is also known, wherein the copper layers are separated from one another by electrically insulating layers.

Printed circuit boards of this type can be used in inverters, for example, in order to convert the direct current which comes from a battery into alternating current. In order to be able to accurately supply the consumer depending on an alternating current, for example an electric motor, with current, said current has to be measured. In this case, tapering the current conducting layers, i.e. the electrically conductive elements, at one point and thereby enabling the current measurement by a current sensor is known. Tapering the current conducting layers amplifies the magnetic field arising around these electrical conductors and it can be measured as a result.

However, a problem arises in this case is that a current-carrying capacity of the printed circuit board is reduced at the tapered point. This can be countered by the current conducting layers of the printed circuit board being formed to be thicker. Current conducting layers which are known have a thickness of approximately 100 μm, they can be up to 400 μm thick. The current-carrying capacity of the printed circuit board is indeed increased again as a result of this measure, certainly it will be significantly higher and more costly.

On the basis of this, what is needed is a printed circuit board arrangement in the case of which an accurate current measurement is possible, and which can still be manufactured in a cost-effective manner in this case.

SUMMARY

In order to solve the above problem, it is proposed herein that a printed circuit board arrangement has a busbar which is arranged on one of a lateral surface of a printed circuit board and is in contact with all current conducting layers of the printed circuit board.

The disclosure provides for at least one part of current flowing through the printed circuit board is branched off to the busbar. The current flowing through the printed circuit board can then also be measured outside of the printed circuit board. It is therefore no longer necessary to taper the current conducting layers in the printed circuit board at a point for current measurement. As a result, the current conducting layers may remain substantially thinner. Thus, the disclosure provides for withdrawing the current measurement from the printed circuit board.

In this case, the printed circuit board arrangement includes the printed circuit board and the busbar. The manner in which the printed circuit board is designed in detail is, in principle, not relevant in this case.

In one exemplary arrangement, the busbar can advantageously have a constriction. In one exemplary arrangement, the constriction is arranged in the middle of the busbar. Reference shall also be made further on to the middle of the printed circuit board. In the present application, the middle is understood to mean that the described position is merely not completely at the end of the busbar or the printed circuit board. In this case, it does not have to be the exact middle, nor does it have to be a region substantially in the middle. The constriction is used, as described for the current conducting layers, in order to increase the magnetic field which is generated by the current flowing through the busbar and thereby to enable a current measurement by the magnetic field. The constriction is therefore arranged in such a way that the magnetic field generated therefrom can be tapped in an optimal manner by a current sensor. In one exemplary arrangement, the current sensor is arranged between the busbar and the printed circuit board. When the printed circuit board is seen from a plan view, it is therefore not located adjacent to or above the busbar, but rather below it.

It should be noted that the position of the middle of both the busbar and the printed circuit board is related to the longitudinal axis of the respective component in this case.

In one exemplary arrangement, the busbar can bypass the current sensor. It can then be fixed to the printed circuit board as usual, and the busbar runs over the current sensor like a bridge. This arrangement is more cost effective than alternatively providing the printed circuit board with a thicker insulating layer into which the current sensor is embedded.

In one exemplary arrangement, the current conducting layers can be cut in the middle or otherwise electrically insulated and can be connected via the busbar. In this case, as described above, the concept of the middle is to be understood generously. In this configuration, the total current which flows through the printed circuit board also flows through the busbar. The current measurement can be optimized as a result.

In one exemplary arrangement, the busbar can advantageously have a greater thickness than a current conducting layer of the printed circuit board. In particular, the busbar can also have a greater thickness than all current conducting layers of the printed circuit board combined. If the printed circuit board has eight current conducting layers of 100 μm thickness, for example, they have a total thickness of 800 μm added up. In contrast, provision can be made for the busbar to have a thickness of at least one millimeter, for example. The narrow point of the busbar can be compensated at this point by a greater thickness. In this case, the thickness can be adjusted as required. The disadvantage with the printed circuit board is that even if only the thickness of one individual layer had to be increased, the thickness of further current conducting layers would have to be increased for reasons of symmetry. Such a necessity does not exist in the case of the busbar, as a result of which the total thickness of the printed circuit board arrangement can also be kept to a minimum.

In one exemplary arrangement, the busbar can advantageously enclose a smaller area than the current conducting layers. The current conducting layers no longer have to traverse the full length of the printed circuit board, the current is conducted through the busbar to some extent. In extreme cases, the area covered by the current conducting layers may even be very small. Nevertheless, the sections of a current conducting layer are positioned in such a way that they enclose a greater area than the busbar. Therefore, if the busbar is placed on a current conducting layer, said busbar does not cover it completely.

In one exemplary arrangement, the busbar can be fixed to the printed circuit board by SMD. SMD as used herein refers to surface mounting technology, i.e., a surface mounting device. The busbar is then arranged substantially parallel to the surface of the printed circuit board.

In addition, the disclosure relates to an inverter with an intermediate circuit capacitor and a printed circuit board arrangement. The inverter is characterized by the fact that the printed circuit board arrangement is designed as described.

In addition, the disclosure relates to a motor vehicle with a power electronics having a printed circuit board arrangement. The motor vehicle is characterized by the fact that the printed circuit board arrangement is designed as described. In particular, the motor vehicle can have an inverter as described.

BRIEF DESCRIPTION OF DRAWINGS

Further advantages, features and details of the disclosure are set forth in the following description of exemplary arrangements and figures. The following are shown therein.

DETAILED DESCRIPTION

Figure 1:
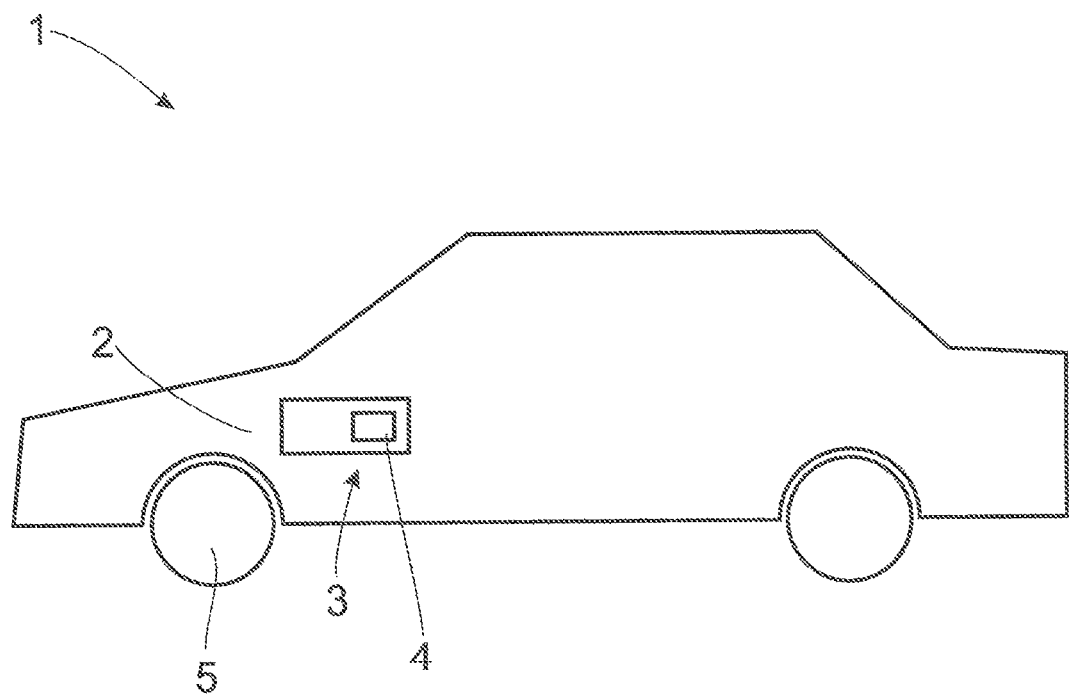
FIG. 1 shows a motor vehicle.

FIG. 1 shows a motor vehicle 1 with a power electronics 2, for example in the form of an inverter 3. The motor vehicle 1 comprises a printed circuit board arrangement 4, as described below in greater detail.

In particular, the motor vehicle 1 can have an electric axis 5. In one exemplary arrangement, the motor vehicle 1 is designed as a hybrid motor vehicle or as an electric vehicle.

Figure 2:
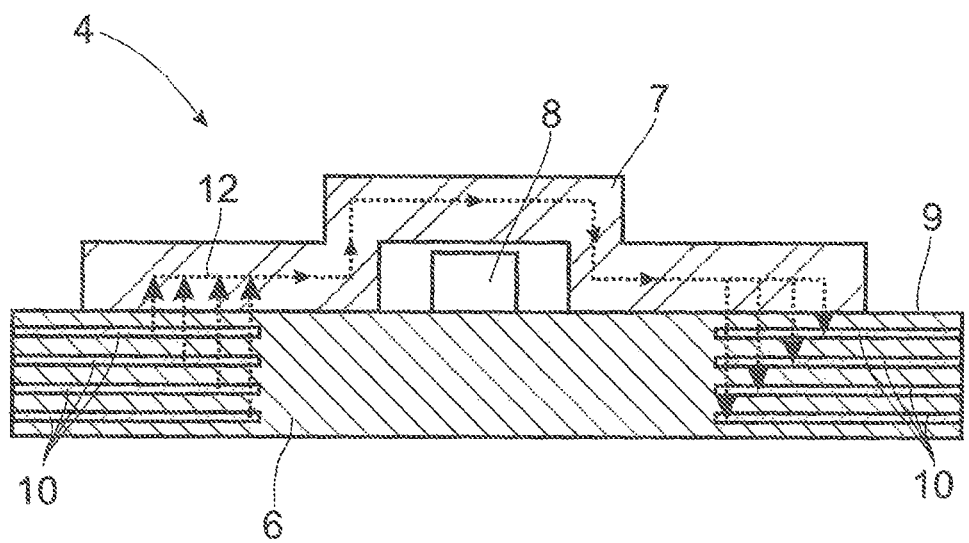
FIG. 2 shows a printed circuit board arrangement in a side view.

FIG. 2 shows a printed circuit board arrangement 4 in a side view. The printed circuit board arrangement 4 has a printed circuit board 6 as well as a busbar 7. A current sensor 8 is represented as an individual electrical component, but the printed circuit board 6 can of course be equipped with a multiplicity of electrical components. For example, power switches can be present at the printed circuit board 6. In the configuration shown, the current sensor 8 is in contact with the printed circuit board 6. The busbar 7 is fixed to one of the surfaces 9 of the printed circuit board 6. In one exemplary arrangement, the busbar 7 is fixed to the busbar by using SMD soldering. The busbar 7 is electrically connected to all current conducting layers 10, four of which are rigidly placed. The current conducting layers 10 are separated in the middle, so that the total current first flows over the current conducting layers 10 and then over the busbar 7.

The thickness of the busbar 7 is greater than the total thickness of all current conducting layers 10. In one exemplary arrangement, the busbar 7 as well as the current conducting layers 10 are constructed of copper. Of course, the busbar 7 can also have a different material than the current conducting layers 10.

The current flow is represented by arrows 12. In this case, it can be recognized that the busbar 7 is electrically connected to all current conducting layers, so that the total current which flows through the printed circuit board 6 is diverted on the middle piece of the printed circuit board 6 via the busbar 7.

Figure 3:
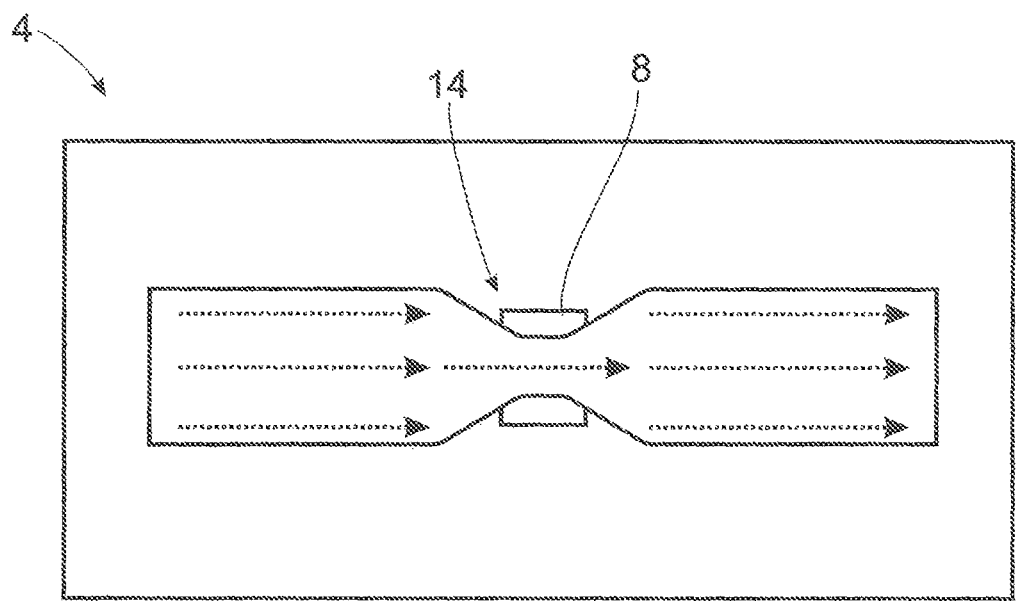
FIG. 3 shows a printed circuit board arrangement in the plan view.

FIG. 3 shows the printed circuit board arrangement 4 according to FIG. 2 in plan view. In this case, it can be recognized that the busbar 7 has a taper 14 in the middle. This serves to concentrate a magnetic field generated by the electrical current. This magnetic field is measured by the current sensor 8 and is considered for determining the current strength. The current-carrying capacity of the printed circuit board arrangement 4 is specified by the fact that the busbar 7 has a sufficient thickness at the corresponding point. In this case, the total thickness of the printed circuit board arrangement 4 can nevertheless be kept to a minimum, since not all of the current conducting layers 10 have to be thickened. In particular, the busbar 7 can have a thickness which is greater than one millimeter, while the individual current conducting layers 10 can furthermore have a thickness of 100 μm.

It is also apparent from FIG. 3 that the busbar 7 encloses a smaller area than the current conducting layers 10. In any case, the current conducting layers 10 are applied to the printed circuit board 6 at the edges and thus enclose an area which corresponds to the area of the printed circuit board. In contrast, the busbar 7 encloses a much smaller area.

The invention claimed is:

1. A printed circuit board arrangement, comprising a printed circuit board with at least two current conducting layers, wherein the current conducting layers extend in an axial direction of the printed circuit board, are arranged in succession in a thickness direction of the printed circuit board, and are separated in a middle section such that the current conducting layers do not extend across an entirety of the printed circuit board, when viewed in cross section, wherein the printed circuit board arrangement has a busbar which is arranged on one lateral surface of the printed circuit board and is in contact with at least one part of the current conducting layers of the printed circuit board; and wherein the busbar has a greater thickness than the current conducting layers of the printed circuit board.

2. The printed circuit board arrangement according to claim 1, wherein the busbar has a constriction.

3. The printed circuit board arrangement according to claim 2, wherein a current sensor is centered at the constriction, between the busbar and the printed circuit board.

4. The printed circuit board arrangement according to claim 3, wherein the busbar bypasses the current sensor.

5. The printed circuit board arrangement according to claim 2, wherein the current conducting layers are cut in the middle and are connected via the busbar.

6. The printed circuit board arrangement according to claim 1, wherein a current sensor is arranged between the busbar and the printed circuit board.

7. The printed circuit board arrangement according to claim 3, wherein the busbar bypasses the current sensor.

8. The printed circuit board arrangement according to claim 1, wherein the current conducting layers are cut in the middle and are connected via the busbar.

9. The printed circuit board arrangement according to claim 8, wherein the thickness of the busbar is greater than a thickness of all of the current conducting layers, together of the printed circuit board.

10. The printed circuit board arrangement according to claim 8, wherein the busbar has a thickness of at least one millimeter.

11. The printed circuit board arrangement according to claim 8, wherein the busbar encloses a smaller area than the current conducting layers.

12. The printed circuit board arrangement according to claim 8, wherein the busbar is fixed to the printed circuit board by SMD soldering.

13. The printed circuit board arrangement according to claim 1, wherein the busbar has a thickness of at least one millimeter.

14. The printed circuit board arrangement according to claim 1, wherein the busbar encloses a smaller area than the current conducting layers.

15. The printed circuit board arrangement according to claim 1, wherein the busbar is fixed to the printed circuit board by SMD soldering.

16. An inverter comprising an intermediate circuit capacitor and a printed circuit board arrangement, wherein the printed circuit board arrangement is designed according to claim 1.

17. A motor vehicle with a power electronics having a printed circuit board arrangement, wherein the printed circuit board arrangement is designed according to claim 1.

18. A printed circuit board arrangement, comprising:
a printed circuit board with at least two current conducting layers, wherein the current conducting layers extend in an axial direction of the printed circuit board, are arranged in succession in a thickness direction of the printed circuit board, and are separated in a middle section such that the current conducting layers do not extend across an entirety of the printed circuit board, when viewed in cross section, the current conducting layers collectively defining a current conducting layer thickness,
wherein the printed circuit board arrangement has a busbar which is arranged on a lateral surface of the printed circuit board and is in contact with all of the current conducting layers of the printed circuit board;
wherein the busbar has a constriction; and
wherein a thickness of the busbar is greater than the current conducting layer thickness.

19. The printed circuit board arrangement of claim 18, wherein the current conducting layers are cut in the middle and are connected via the busbar.

* * * * *